United States Patent

Garvis

[11] Patent Number: 5,647,011
[45] Date of Patent: Jul. 8, 1997

[54] HEADPHONE SOUND SYSTEM

[76] Inventor: Andrew W. Garvis, 310 Sabal Park Pl. #100, Longwood, Fla. 32779

[21] Appl. No.: 409,594

[22] Filed: Mar. 24, 1995

[51] Int. Cl.$^6$ .................................................. H02B 1/00
[52] U.S. Cl. ........................... 381/123; 381/74; 381/104; 381/110
[58] Field of Search .......................... 381/122, 74, 110, 381/104, 86, 183, 123, 107

[56] References Cited

U.S. PATENT DOCUMENTS

| | | | |
|---|---|---|---|
| 3,280,272 | 10/1966 | Simpson | 179/100 |
| 3,518,375 | 6/1970 | Hawkins | 179/1 |
| 4,006,310 | 2/1977 | Bayer | 179/1 |
| 4,061,874 | 12/1977 | Fricke et al. | 179/1 |
| 4,455,677 | 6/1984 | Fox | 381/110 |
| 4,754,486 | 6/1988 | Stafford et al. | 381/86 |
| 4,881,123 | 11/1989 | Chapple | 381/104 |
| 4,975,964 | 12/1990 | Hochstein | 381/110 |
| 5,054,078 | 10/1991 | Schorman et al. | 381/110 |
| 5,243,659 | 9/1993 | Stafford et al. | 381/86 |

Primary Examiner—Curtis Kuntz
Assistant Examiner—Vivian Chang
Attorney, Agent, or Firm—William M. Hobby, III

[57] ABSTRACT

A headphone sound system apparatus includes headphones and a sound system having an output line for the headphones for producing audio signals to the headphones. The sound recognition and interrupt system has the sound system output coupled thereto and to the headphones and has a housing which can be attached to the person, such as being clipped to a belt. The housing has a microphone mounted inside for picking up sounds extraneous to the sound system and a switching circuit mounted in the housing and connected to the microphone and which is actuated by the microphone between on and off positions responsive to signals of predetermined levels being generated by the microphone. The switching circuit disables the connection from the sound source so that a person wearing the headphones has the sound system turned down to thereby be able to hear the extraneous sound that actuated the switching circuit. The switching circuit is manually actuated to reconnect the sound source to the headphones. The switching circuit includes a transistor switch and an SCR latching circuit and is such that any headphones or sound system, such as a portable CD player, can be plugged into the sound recognition and interrupt system.

3 Claims, 3 Drawing Sheets

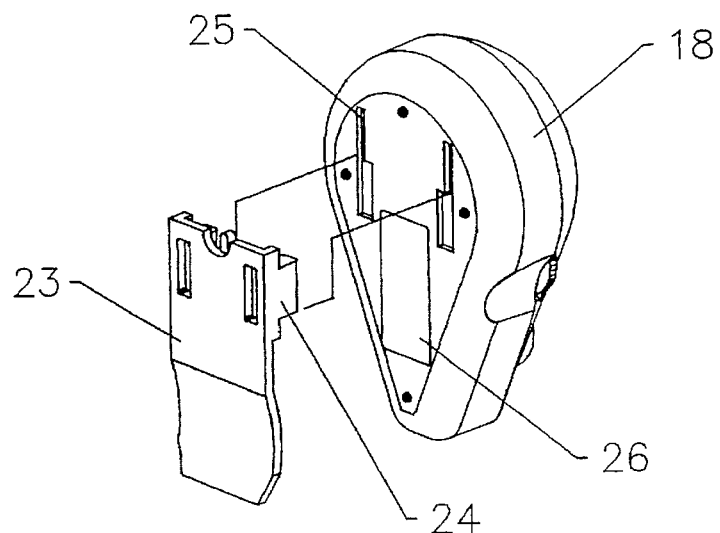
*Fig 4*
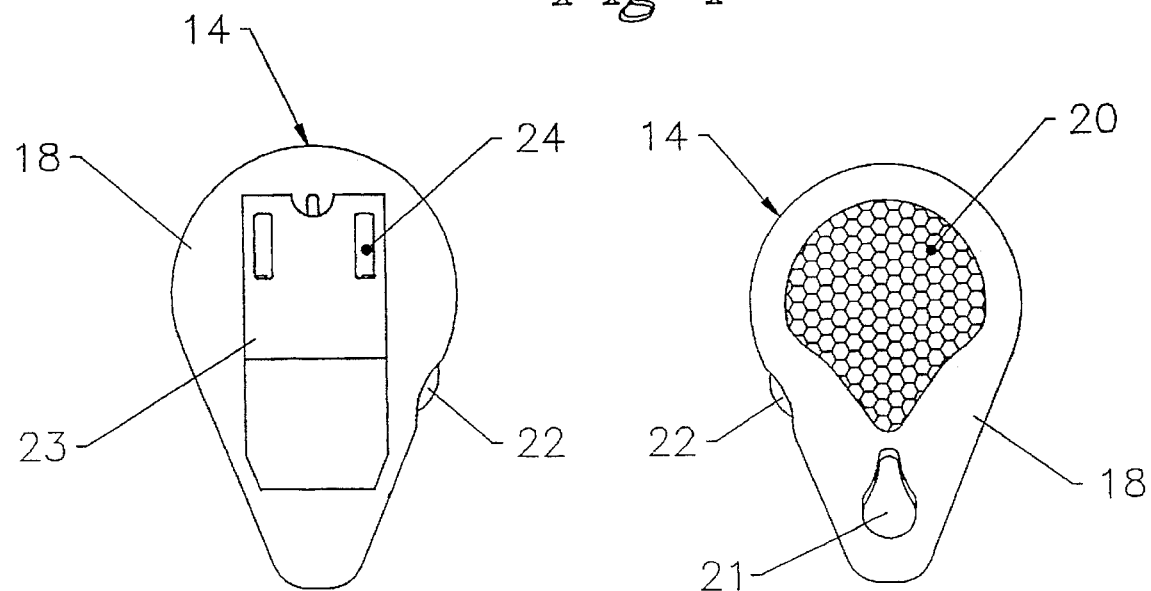
*Fig 3*  *Fig 2*

HEADPHONE SOUND SYSTEM

BACKGROUND OF THE INVENTION

The present invention relates to portable sound systems which are used in connection with headphones and especially to a sound recognition and interrupt system for disengaging the connection between the sound source and the headphone.

The popularity of portable sound systems, such as portable CD players and portable cassette players, connected to headphones, has reached an ever expanding market. Portable stereo systems used in connection with headphones have been used by runners and joggers as well as by walkers and people traveling in cars and flying in airplanes. One of the problems encountered in the wide usage of such headphone stereo systems is that while the listener has the headphones on, he cannot hear extraneous noises, such as sirens or emergency warning devices. When a person has earphones in place over the ears with the sound system playing loud music or the like, extraneous sound signals are completely obliterated. The signals thus become a hazard to the user of the headphones in the case of emergency or warning signals and are inconvenient when anyone desires to communicate with a person using the headphone stereo system. The headphone wearer, in effect, is tuned out to loud from all extraneous noises and communications.

It has been suggested in the past to pick up extraneous sounds, especially in automobiles and vehicles, and recreate the sounds within the vehicle cab, either over the radio or to interrupt the radio and produce the sounds. This becomes important within vehicles since persons driving with the windows up and a radio playing are unable to hear sirens or emergency vehicles, which may be result in endangering people's lives. The problem is aggravated by portable stereo systems worn by people driving cars or in vehicles since, even if the radio is turned down and a warning is made within the vehicle, the wearer of the headphones would not hear the extraneous sounds.

The present invention is directed towards a simplified system that can be attached to a belt of a person with headphones and listening to a sound system. Both the headphones and the sound system are plugged into the belt unit which can detect extraneous sounds of a predetermined level to switch off the sound system and to amplify the extraneous sounds, if desired, and then to allow the user to switch the sound system back on manually when he had heard the extraneous sounds.

There have been a number of systems which use voice actuated switches in connection with intercom systems to switch off a stereo audio system. A person's voice actuates the intercom and then switches the stereo system back on. This type of system, for instance, has been suggested especially for motorcycle drivers having a passenger, both of which can be connected to an intercom system. In the Stafford et al. U.S. Pat. No. 4,754,486, a motorcycle stereo audio system with vox intercom is provided to allow intercom communication between the motorcycle driver and a passenger while providing stereo listening in both the right and left helmet earphones and intercom communication through microphones which are always actuated and located proximate to the mouth of both driver and passenger. In the Bayer U.S. Pat. No. 4,006,310, a noise discriminating voice switched two-way intercom system is provided for remote banking which facilitates communication between a teller terminal and a remotely located customer terminal. In the Stafford et al. U.S. Pat. No. 5,243,659, another motorcycle stereo audio system with vox intercom is provided such that initial speaking in the microphone terminates the stereo output of both right and left speakers of the driver and passenger helmets so that the intercom conversation is heard in full. In the Chapple U.S. Pat. No. 4,881, 123, an audio system has a voice override and voice amplification control circuitry to provide high quality music to a listener through a set of headphones and includes a microphone and a foot operated switch to allow a user to override the music signal to communicate with the listener.

In the Hochstein U.S. Pat. No. 4,975,964, an automatic turn off system senses the presence of electrical signals for use in a wireless audio speaker system for turning off the speaker system in the absence of the audio signal. In the Simpson U.S. Pat. No. 3,280,272, a muting switch mechanism for an automatic record changer is provided for preventing the noise created by the record changing mechanism from being amplified and transmitted through the speaker system. The Schorman et al. U.S. Pat. No. 5,054,078, is a method and apparatus to suspend so that a person listening to a radio in a noisy environment, such as an automobile, who might normally miss some of the received speech when the noise occurs, such as a horn honking or a door being slammed or a person in the car speaks. In such case, the radio user may have to ask the person at the other end to repeat the message. This system provides a storage buffer to store information that might otherwise be lost. In the Hawkins U.S. Pat. No. 3, 518,375, a voice override circuit is provided in which a voice signal from a microphone automatically suppresses a normal music signal and resumes after the voice signal terminates. In the Fricke et al. U.S. Pat. No. 4,061,874, a system for reproducing sound information controls a car radio or the like playing in traffic or engine noise by controlling the volume in dynamic range of the audio amplifier using an ambient acoustic noise sensor. In the Fox U.S. Pat. No. 4,455,677, a multipurpose headphone assembly is used in connection with a stereophonic system and detects noises extraneous to the stereophonic output system using a pickup microphone and one or more speaker assemblies for ambient sound pickup. The pickup microphone is connected to an automatically actuated switch which closes whenever the pickup microphone detects certain ambient sounds extraneous to the system. The automated switch assembly is directly interconnected with a voice compressor assembly and then directly to an amplifier to provide minimal amplification of such extraneous sounds.

In contrast to the prior systems, the present system is a self-contained unit for attaching to the belt of an individual or to his clothing or body and which allows for the headphones to be plugged thereinto with the CD player or cassette player plugged thereinto so that the sound from the sound source to the headphones can be interrupted subject to predetermined sound levels being picked up by a microphone in the housing to switch off the connection between the sound source and the earphone, which connection is manually reset at the option of the user. Extraneous sounds can also be processed as desired.

SUMMARY OF THE INVENTION

A headphone sound system apparatus includes headphones and a sound system having an output line for the headphones for producing audio signals to the headphones. The sound recognition and interrupt system has the sound system output coupled thereto and to the headphones and has a housing which can be attached to the person, such as being clipped to a belt. The housing has a microphone mounted inside for picking up sounds extraneous to the sound system and a switching circuit mounted in the housing and connected to the microphone and which is actuated by the microphone between on and off positions responsive to signals of predetermined levels being generated by the microphone. The switching circuit disables the connection from the sound source so that a person wearing the headphones has the sound system turned down to thereby be able to hear the extraneous sound that actuated the switching circuit. The switching circuit is manually actuated to reconnect the sound source to the headphones. The switching circuit includes a transistor switch and an SCR latching circuit and is such that any headphones or sound system, such as a portable CD player, can be plugged into the sound recognition and interrupt system.

BRIEF DESCRIPTION OF THE DRAWINGS

Other objects, features, and advantages of the present invention will be apparent from the written description and the drawings in which:

FIG. 2 is a front elevation of the detection and interrupt system in accordance with FIG. 1;

FIG. 3 is a rear elevation of the detection and interrupt system of FIGS. 1 and 2;

FIG. 4 is an exploded perspective view of the detection and interrupt housing and belt clip.

DETAILED DESCRIPTION OF THE PREFERRED EMBODIMENT

Figure 1:
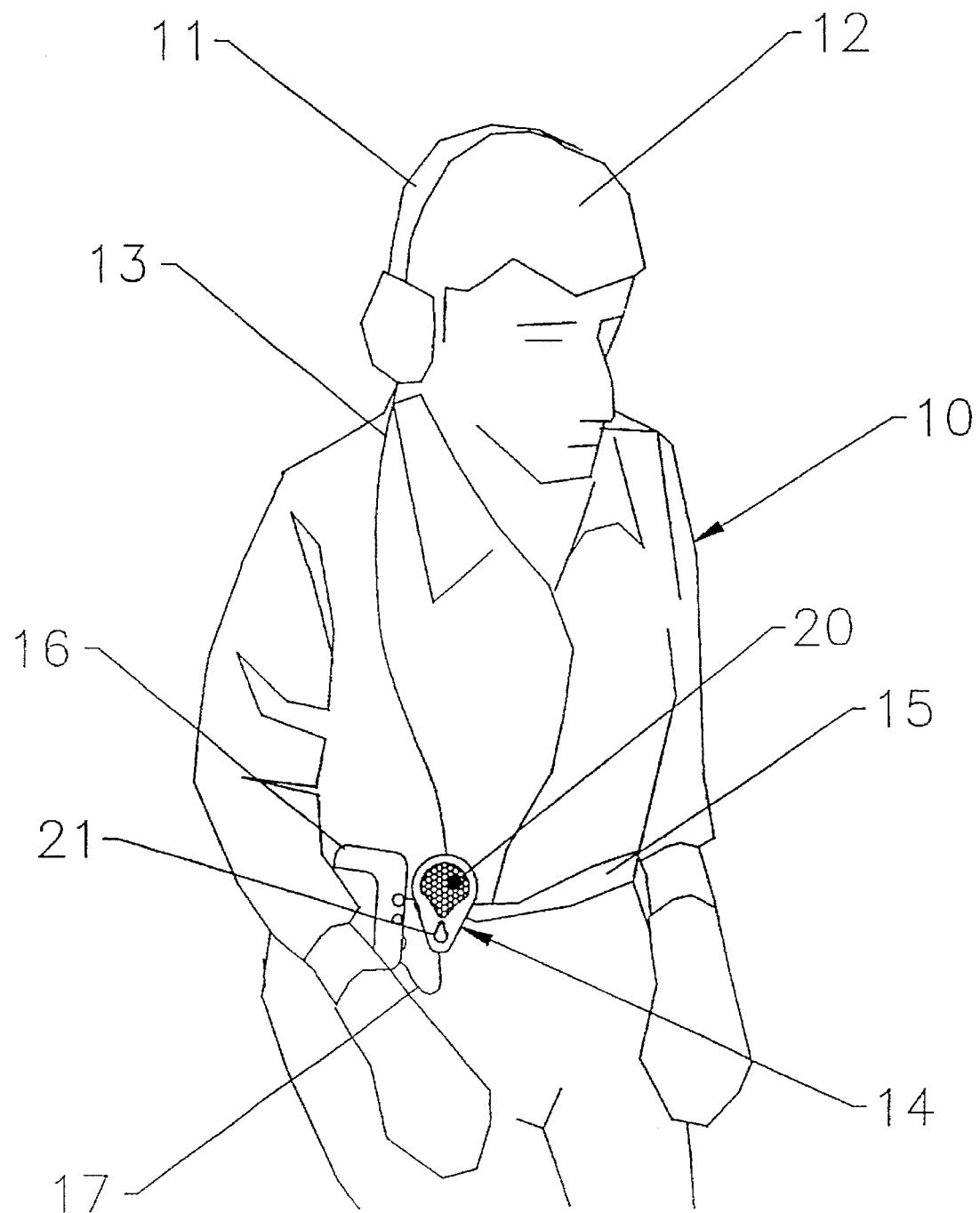
FIG. 1 is a perspective view of a person wearing a portable sound system using the present detection and interrupt system.

Referring to the drawings and especially to FIG. 1, a person 10 has a pair of headphones 11 attached over his head 12 and connected through a headphone input line 13 to a detection and interrupt system 14 attached to the belt 15 of the user 10. A portable personal stereo system 16 may be a portable CD player or cassette player or radio and is connected through a conductor 17 to a plug connector in the detection and interrupt device 14. The detection and interrupt circuit 14 includes the housing 18 and a grill 20 having a microphone mounted therebehind along with a reset switch 21.

As more clearly seen in FIGS. 2 and 3, the detection and interrupt circuit 14 has the housing 18 with the grill 20 mounted on the front thereof having a microphone supported therebehind. The reset button 21 is mounted on the front of the housing where it can be rapidly pushed by the user to reset the circuit following the stereo system 16 being disconnected from the headphones 11. An input sensitivity control 22 allows the sensitivity of the circuit to be adjusted so that the user can adjust the level of sound that he desires to have interrupt the stereo system by adjusting the rotating sensitivity control 22. The housing 18 has, as seen from the rear, a belt clip 23 attached thereto for attaching to the belt 15 of the user.

The belt clip 23 has mounting studs 24 thereon, as more clearly seen in connection with FIG. 4, which are slid into mounting slots 25 on the housing 14. In addition, a strip of VELCRO 26 can be attached between the clip 23 in the back of the housing 18 which can be used to hold the clip 23 and, alternatively, to allow the clip 23 to be removed from the housing 18 and attached to a belt or shirt with the VELCRO 26 when used in connection with other hook and loop materials.

Figure 5:
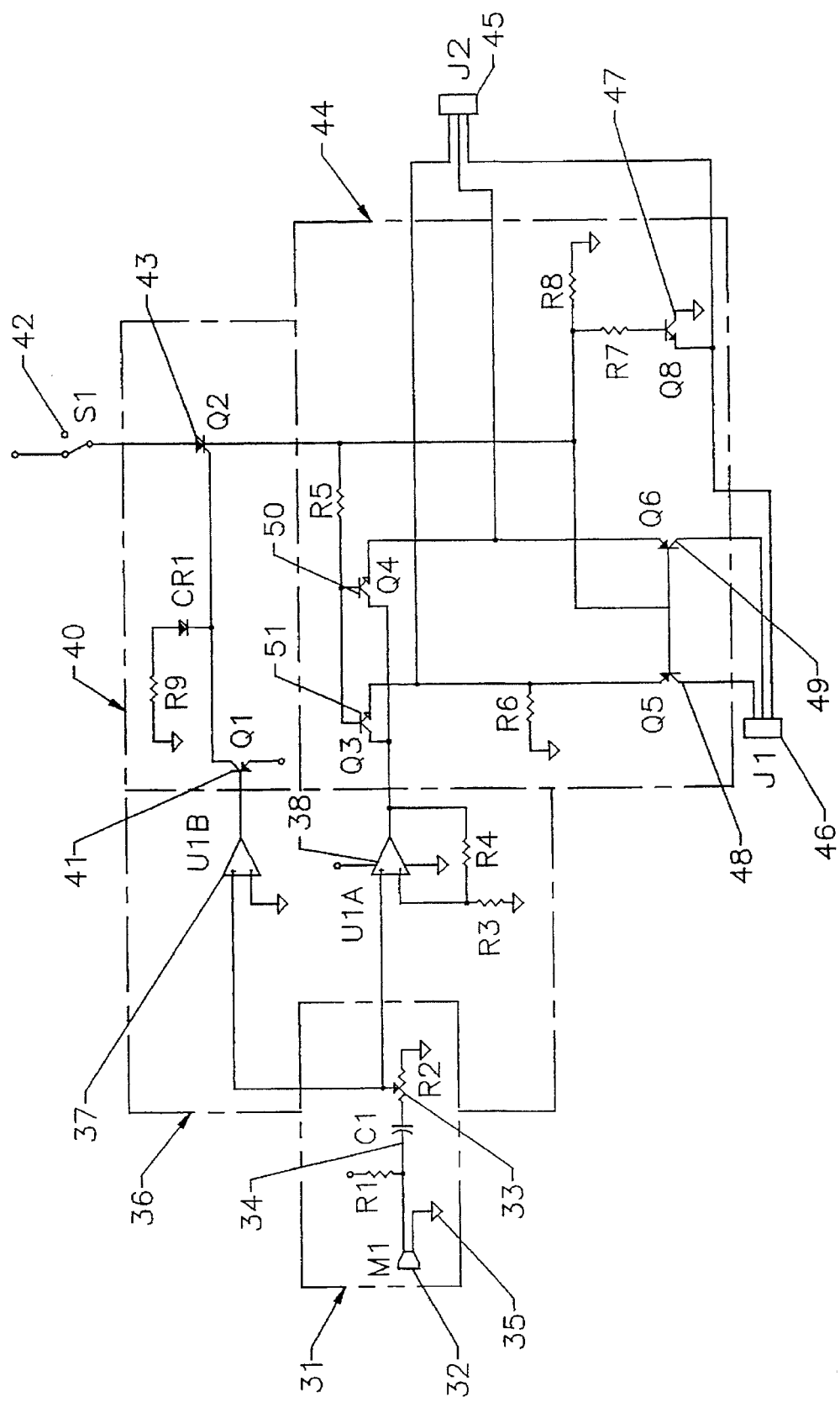
FIG. 5 is a circuit diagram for the detection and interrupt system of the present invention.

Turning to FIG. 5, a preferred embodiment of a detection and interrupt circuit 30 includes a microphone circuit 31 having a microphone 32 mounted therein and having a microphone sensitivity control 33 mounted in-line with the microphone circuit connection line 34. The microphone is grounded at 35. The microphone control circuit 31 is connected to a sound amplification circuit 36 having a pair of amplifiers 37 and 38 connected from the microphone 32 for amplifying the signals picked up by the microphone 32. The amplifier 37 is connected to a latching circuit 40 having a transistor 41 to act as a switch for the silicone control rectifier or SCR 43 for latching the circuit in a disengaged position cutting off the sound source from the headphones. A manual reset switch 42 is also connected through the SCR 41 for manually resetting the SCR latching circuit 40. The amplifier 38 as well as the latching circuit 40 are connected to an output control circuit 44 which in turn is connected to an output jack 45 from which the headphones are attached by virtue of a plug connector. The output control circuit 44 also has an input plug 46 for attaching the personal stereo system.

By plugging the personal stereo system into the input plug 46 and the headphones into the output jack 45, the stereo sound signals from the personal stereo are conveyed to the output jack and into the headphones until such time as the output control circuit interrupts the signal and the latching circuit latches the circuit to interrupt the transmission of the signals from the input plug to the output jack 45. The transistor 47 of the output control circuit 44 switches the ground while the transistor 48 and 49 shuts off the CD input signal. The transistor circuit 50 and 51 act to switch some of the audio sounds from the amplification circuit 36 to the headphones so that the user of the headphones can hear the extraneous sounds being picked up by the microphone 32 only after the output control circuit transistor 47 has been switched to ground. Applicant does not intend to be limited to any particular electronic circuit but the following values can be used within headphone control circuits in accordance with the present invention.

| Resistors | |
|---|---|
| R1 = 33k | C1 = .001 mf |
| R2 = 10k | Amp 37 = U1b L (385) |
| R3 = 1k | Amp 38 = U1a LM (385) |
| R4 = 100k | Q1 = 2N 2907 |
| R5 = 100k | Q4 = 2N 222 |
| R6 = 1k | Q5 = 2N 222 |
| R7 = 1k | Q6 = 2N 2907 |
| R8 = 1k | Q7-2N 2907 |
| R9 = 1k | Q8 = 2N 2907 |
| R10 = 1k | |
| R11 = 33k | |

The VCC voltage can be twelve volts and all resistors are one quarter watt.

It should be clear at this time that a detection and interrupt circuit has been provided which can advantageously latch a disconnect or interrupt circuit to cut off a signal from an audio sound source to a headphone of a user subject to predetermined extraneous noises and which can amplify and process the extraneous noises to feed them to the headphones, as desired. The circuit stays latched until manually reset at the option of the user. However, the present invention should not be construed as limited to the forms shown which are to be considered illustrative rather than restrictive.

I claim:

1. A headphone sound system comprising headphones;

a sound system comprising a standard portable CD player or cassette player having an output line for said headphones for producing audio signals for said headphones;

a sound recognition and interrupt system having the sound system output coupled therethrough to said headphones, said sound recognition system having:

a housing having a belt attachment for attaching to a person's belt;

a microphone mounted inside said housing for picking up sounds extraneous to said sound system; and switching circuit located in said housing and connected to be actuated by said microphone to switch said switching circuit between on and off positions responsive to signals of a predetermined level being generated by said microphone, said switching circuit being connected between said sound system and said headphones for reducing the audio signals from said sound system to said headphones responsive to predetermined levels of extraneous sounds being received by said microphone, and said switching circuit having a transistor shutoff switch for shutting off said sound system and an SCR latching circuit, said switching circuit also having a manual actuated level control for controlling the input signal of extraneous sound from said microphone; whereby a person wearing said headphones has the sound system turned down to thereby hear extraneous sounds exceeding a predetermined level;

a manual reset switch attached to said housing and connected to said switching circuit for reconnecting said sound system to said microphones; and said housing having a sound system input jack and headphone output jack mounted thereto for removably attaching said sound system and said headphones through said switching circuit.

2. A headphone sound system in accordance with claim 1 in which an amplifier is connected to said microphone and to said headphones and amplifies any extraneous sound from said microphone to said headphones.

3. A headphone sound system in accordance with claim 1 in which said belt attachment is a belt clip.

* * * * *